United States Patent
Ueda et al.

(10) Patent No.: US 11,272,608 B2
(45) Date of Patent: Mar. 8, 2022

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Atsushi Ueda, Oyama (JP); Shinji Nagai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/226,515

(22) Filed: Apr. 9, 2021

(65) Prior Publication Data

US 2021/0235571 A1    Jul. 29, 2021

Related U.S. Application Data

(63) Continuation of application No. PCT/JP2018/042360, filed on Nov. 15, 2018.

(51) Int. Cl.
*H05G 2/00* (2006.01)
*G03F 7/20* (2006.01)
*G21K 1/06* (2006.01)

(52) U.S. Cl.
CPC ......... *H05G 2/008* (2013.01); *G03F 7/70033* (2013.01); *H05G 2/005* (2013.01); *G21K 1/06* (2013.01)

(58) Field of Classification Search
None
See application file for complete search history.

(56) References Cited

U.S. PATENT DOCUMENTS

2012/0313016 A1   12/2012   Fleurov et al.
2013/0161540 A1   6/2013   Nagai et al.
(Continued)

FOREIGN PATENT DOCUMENTS

JP   2008-277481 A   11/2008
JP   2013-135033 A   7/2013
(Continued)

OTHER PUBLICATIONS

International Search Report issued in PCT/JP2018/042360, dated Jan. 29, 2019.
(Continued)

*Primary Examiner* — Michelle M Iacoletti
(74) *Attorney, Agent, or Firm* — Studebaker & Brackett PC

(57) ABSTRACT

An extreme ultraviolet light generation apparatus may include a chamber causing a target substance to be turned into plasma with laser light, a light concentrating mirror concentrating extreme ultraviolet light generated by the turning of the target substance into plasma, a gas supply unit supplying gas into the chamber, a magnetic field generation unit generating a magnetic field including a magnetic field axis that crosses a light path of the extreme ultraviolet light, a first exhaust port arranged at a position through which the magnetic field axis passes in the chamber, a second exhaust port arranged at a position opposite to the light concentrating mirror in the chamber, and a gas exhaust amount adjustment unit adjusting a ratio between an exhaust amount of first exhaust gas exhausted from the first exhaust port and an exhaust amount of second exhaust gas exhausted from the second exhaust port.

11 Claims, 9 Drawing Sheets

(56) References Cited

U.S. PATENT DOCUMENTS

| | | |
|---|---|---|
| 2013/0319466 A1 | 12/2013 | Mizoguchi et al. |
| 2017/0238407 A1 | 8/2017 | Nagai et al. |
| 2018/0173117 A1 | 6/2018 | Chien et al. |
| 2018/0224748 A1 | 8/2018 | Nagai et al. |

FOREIGN PATENT DOCUMENTS

| | | | |
|---|---|---|---|
| JP | 2013-251381 A | 12/2013 | |
| JP | 2014-523640 A | 9/2014 | |
| WO | 2016/098193 A1 | 6/2016 | |
| WO | 2017/077641 A1 | 5/2017 | |
| WO | WO-2018229838 A1 * | 12/2018 | .............. G01J 1/429 |

OTHER PUBLICATIONS

Written Opinion of the International Searching Authority issued in PCT/JP2018/042360, dated Jan. 29, 20218.

* cited by examiner

EXTREME ULTRAVIOLET LIGHT GENERATION APPARATUS AND ELECTRONIC DEVICE MANUFACTURING METHOD

CROSS-REFERENCE TO RELATED APPLICATIONS

The present application is a continuation application of International Application No. PCT/JP2018/042360, filed on Nov. 15, 2018, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 20 nm or less will be required. Therefore, it is expected to develop an exposure apparatus that combines an apparatus for generating extreme ultraviolet (EUV) light having a wavelength of about 13 nm with a reduced projection reflection optical system.

As an EUV light generation apparatus, three types of apparatuses have been proposed: a laser produced plasma (LPP) type apparatus using plasma generated by irradiating a target substance with laser light, a discharge produced plasma (DPP) type apparatus using plasma generated by discharge, and a synchrotron radiation (SR) type apparatus using synchrotron radiation light.

LIST OF DOCUMENTS

Patent Documents

Patent Document 1: US Patent Application Publication No. 2018/0224748
Patent Document 2: US Patent Application Publication No. 2013/0161540

SUMMARY

An extreme ultraviolet light generation apparatus according to an aspect of the present disclosure includes a chamber configured to cause a target substance to be turned into plasma with laser light radiated to a plasma generation region at an internal space of the chamber, a light concentrating mirror configured to concentrate extreme ultraviolet light generated by the turning of the target substance into plasma, a gas supply unit configured to supply gas into the chamber, a magnetic field generation unit configured to generate a magnetic field including a magnetic field axis that crosses a light path of the extreme ultraviolet light, a first exhaust port arranged at a position through which the magnetic field axis passes in the chamber, a second exhaust port arranged at a position opposite to the light concentrating mirror in the chamber with reference to a plane passing through the first exhaust port and being perpendicular to an optical axis of the light concentrating mirror, and a gas exhaust amount adjustment unit configured to adjust a ratio between an exhaust amount of first exhaust gas exhausted from the first exhaust port and an exhaust amount of second exhaust gas exhausted from the second exhaust port.

An electronic device manufacturing method according to an aspect of the present disclosure includes generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to produce an electronic device. Here, the extreme ultraviolet light generation apparatus includes a chamber configured to cause a target substance to be turned into plasma with laser light radiated to a plasma generation region at an internal space of the chamber, a light concentrating mirror configured to concentrate the extreme ultraviolet light generated by the turning of the target substance into plasma, a gas supply unit configured to supply gas into the chamber, a magnetic field generation unit configured to generate a magnetic field including a magnetic field axis that crosses a light path of the extreme ultraviolet light, a first exhaust port arranged at a position through which the magnetic field axis passes in the chamber, a second exhaust port arranged at a position opposite to the light concentrating mirror in the chamber with reference to a plane passing through the first exhaust port and being perpendicular to an optical axis of the light concentrating mirror, and a gas exhaust amount adjustment unit configured to adjust a ratio between an exhaust amount of first exhaust gas exhausted from the first exhaust port and an exhaust amount of second exhaust gas exhausted from the second exhaust port.

BRIEF DESCRIPTION OF THE DRAWINGS

Embodiments of the present disclosure will be described below merely as examples with reference to the accompanying drawings.

DESCRIPTION OF EMBODIMENTS

Figure 1:
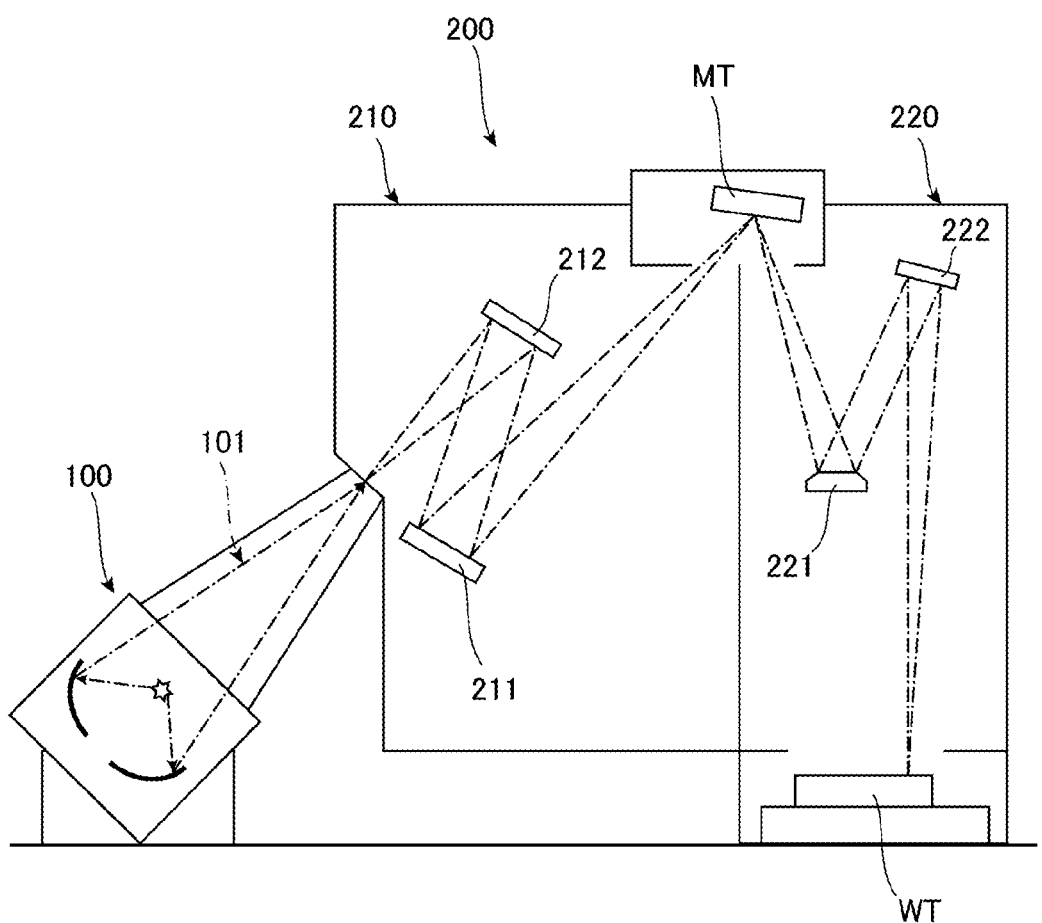
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of extreme ultraviolet light generation apparatus of first embodiment
   4.1 Configuration
   4.2 Operation
   4.3 Effect
5. Description of extreme ultraviolet light generation apparatus of second embodiment
   5.1 Configuration
   5.2 Operation
   5.3 Effect
6. Description of extreme ultraviolet light generation apparatus of third embodiment
   6.1 Configuration
   6.2 Operation
   6.3 Effect
7. Description of extreme ultraviolet light generation apparatus of fourth embodiment
   7.1 Configuration
   7.2 Operation
   7.3 Effect Hereinafter, embodiments of the present disclosure will be described in detail with reference to the drawings.

The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) light, and an electronic device manufacturing apparatus. In the following of the present specification, extreme ultraviolet light is referred to as EUV light in some cases.

2. Description of Electronic Device Manufacturing Apparatus

As shown in FIG. 1, an electronic device manufacturing apparatus includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not shown) disposed on the workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
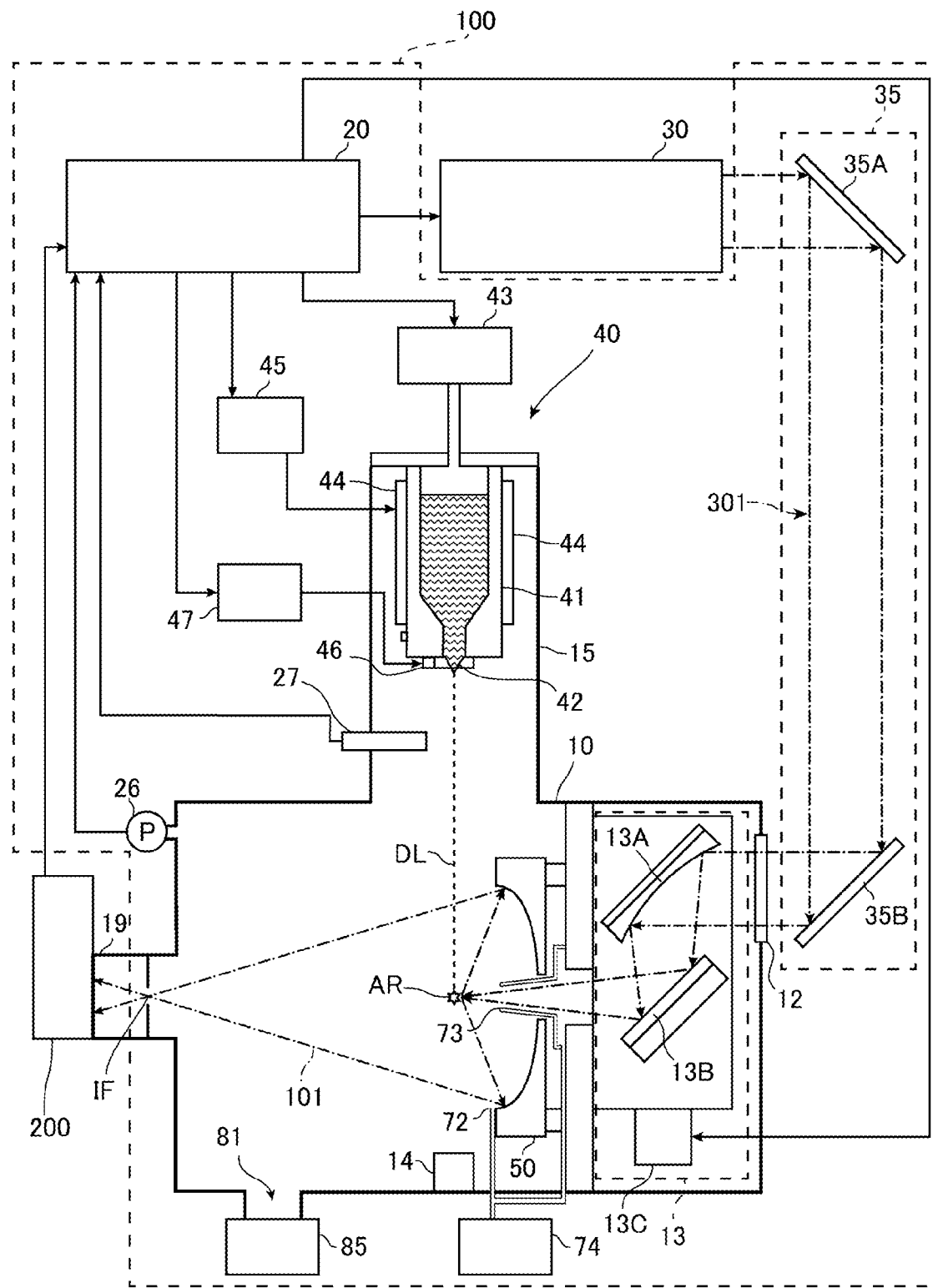
FIG. 2 is a schematic view showing a schematic configuration example of an entire EUV light generation apparatus.

3. Description of Extreme Ultraviolet Light Generation Apparatus of Comparative Example 3.1 Configuration The EUV light generation apparatus of a comparative example will be described. FIG. 2 is a schematic view showing a schematic configuration example of an entire EUV light generation apparatus of the present example. As shown in FIG. 2, a laser device 30 is connected to the EUV light generation apparatus 100 of the present embodiment. The EUV light generation apparatus 100 of the present embodiment includes a chamber 10, a control unit 20, and a laser light delivery optical system 35.

The chamber 10 is a sealable container. The chamber 10 is continuously provided with a sub-chamber 15, and a target supply unit 40 is provided in the sub-chamber 15. The target supply unit 40 includes a tank 41 and a nozzle 42. The target supply unit 40 supplies a droplet DL to the internal space of the chamber 10 and is attached, for example, to penetrate through a wall of the sub-chamber 15. The droplet DL, which is also called a target, is supplied from the target supply unit 40.

The tank 41 stores therein a target substance which becomes the droplet DL. The target substance may include, but is not limited to, any one of tin, terbium, gadolinium, lithium, and xenon, or a combination of any two or more thereof. The inside of the tank 41 communicates, through a pipe, with a pressure adjuster 43 adjusting gas pressure. Further, a heater 44 is attached to the tank 41. The heater 44 heats the tank 41 with current applied from a heater power source 45. Through the heating, the target substance in the tank 41 melts. The pressure adjuster 43 and the heater power source 45 are connected to the control unit 20.

The nozzle 42 is attached to the tank 41 and discharges the target substance. A piezoelectric element 46 is attached to the nozzle 42. The piezoelectric element 46 is connected to a piezoelectric power source 47 and is driven by voltage applied from the piezoelectric power source 47. The piezoelectric power source 47 is connected to the control unit 20. The target substance discharged from the nozzle 42 is formed into the droplet DL through operation of the piezoelectric element 46.

The chamber 10 is provided with a target collector 14. The target collector 14 collects unnecessary droplets DL.

At least one through hole is formed in a wall of the chamber 10. The through hole is blocked by a window 12 through which pulse laser light 301 emitted from the laser device 30 passes.

Further, a laser light concentrating optical system 13 is located in the chamber 10. The laser light concentrating optical system 13 includes a laser light concentrating mirror 13A and a high reflection mirror 13B. The laser light concentrating mirror 13A reflects and concentrates the laser light 301 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser light concentrating position at the internal space of the chamber 10 coincides with a position specified by the control unit 20.

For example, an EUV light concentrating mirror 50 having a spheroidal reflection surface is disposed inside the chamber 10. The EUV light concentrating mirror 50 has first and second focal points. The EUV light concentrating mirror 50 may, for example, be disposed so that the first focal point is located in a plasma generation region AR and the second focal point is located at an intermediate focal point IF. A through hole is formed at the center of the EUV light concentrating mirror 50, and the pulse laser light 301 passes through the through hole.

Further, the EUV light generation apparatus 100 includes a connection portion 19 providing communication between the internal space of the chamber 10 and the internal space of the exposure apparatus 200. A wall in which an aperture is formed is arranged in the connection portion 19. The wall is preferably disposed such that the aperture is located at the second focal point position of the EUV light concentrating mirror 50.

Further, the EUV light generation apparatus 100 includes a pressure sensor 26. The pressure sensor 26 measures pressure at the internal space of the chamber 10. Further, the EUV light generation apparatus 100 includes a target sensor 27 attached to the chamber 10. The target sensor 27 has, for example, an imaging function, and detects the presence, trajectory, position, velocity, and the like of the droplet DL. The pressure sensor 26 and the target sensor 27 are connected to the control unit 20.

The laser device 30 includes a master oscillator being a light source to perform burst operation. The master oscillator emits the pulse laser light 301 in a burst-on duration. The master oscillator is, for example, a laser device configured to emit the laser light by exciting, through electric discharge, gas as mixture of carbon dioxide gas with helium, nitrogen, or the like. Alternatively, the master oscillator may be a quantum cascade laser device. The master oscillator emits the pulse laser light 301 by a Q switch system. The master oscillator may include an optical switch, a polarizer, and the like. In the burst operation, the continuous pulse laser light is emitted at a predetermined repetition frequency in the burst-on duration and the emission of the laser light 301 is stopped in a burst-off duration.

The travel direction of the laser light 301 emitted from the laser device 30 is adjusted by the laser light delivery optical system 35. The laser light delivery optical system 35 includes a plurality of mirrors 35A, 35B for adjusting the travel direction of the laser light 301, and a position of at least any of the mirrors 35A, 35B is adjusted by an actuator (not shown). Owing to that the position of at least any of the mirrors 35A, 35B is adjusted, the laser light 301 can appropriately propagate into the chamber 10 through the window 12.

The control unit 20 includes a computer having a central processing unit (CPU) and the like. The control unit 20 controls the entire EUV light generation apparatus 100 and also controls the laser device 30. The control unit 20 receives a signal related to the pressure at the internal space of the chamber 10, which is measured by the pressure sensor 26, a signal related to image data of the droplet DL captured by the target sensor 27, a burst signal from the exposure apparatus 200, and the like. The control unit 20 is configured to process the image data and the like, and to control, for example, timing at which the droplet DL is output, an output direction of the droplet DL, and the like. Such various kinds of control described above are merely exemplary, and other control is added as described later.

Next, the configuration of the chamber 10 will be described in more detail.

Figure 3:
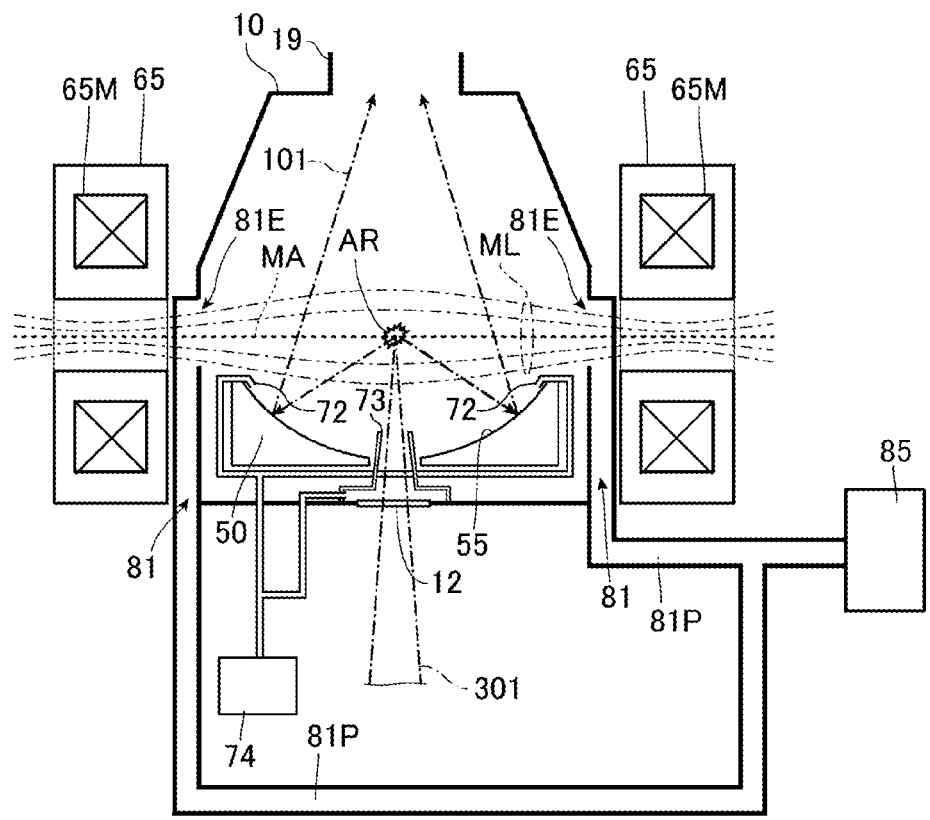
FIG. 3 is a schematic view showing a schematic configuration of a part including a chamber of the EUV light generation apparatus of a comparative example.

FIG. 3 is a schematic view showing a schematic configuration of a part including the chamber 10 of the EUV light generation apparatus 100 of the comparative example. In FIG. 3, the laser light concentrating optical system 13 is omitted. As shown in FIGS. 2 and 3, the chamber 10 is provided with a first gas supply unit 72 and a second gas supply unit 73 for supplying etching gas into the internal space of the chamber 10. The first gas supply unit 72 and the second gas supply unit 73 are connected to the gas supply tank 74 which supplies the etching gas through pipes. When the target substance is tin, the etching gas is, for example, balancing gas having a hydrogen gas concentration of about 3%. The balance gas may include nitrogen ($N_2$) gas or argon (Ar) gas. Hereinafter, description will be provided assuming that the target substance is tin and the etching gas contains hydrogen.

The first gas supply unit 72 is adjusted so that the etching gas supplied into the chamber 10 flows along a reflection surface from the outer periphery of the EUV light concentrating mirror 50. Further, the second gas supply unit 73 has a truncated conical cylindrical shape, and is called a cone in some cases. A gas supply port of the second gas supply unit 73 is inserted into the through hole formed in the EUV concentrating mirror 50, and the second gas supply unit 73 supplies the etching gas from the through hole in a direction away from the EUV light concentrating mirror 50. Further, the laser light 301 passes through the through hole of the EUV light concentrating mirror 50 through the second gas supply unit 73, as described above. Therefore, the window 12 side of the second gas supply unit 73 is configured so that the laser light 301 can pass therethrough.

Tin fine particles and tin ions are generated when the target substance forming the droplet DL is turned into plasma in the plasma generation region AR. The etching gas supplied from the first gas supply unit 72 and the second gas supply unit 73 contains hydrogen that reacts with the tin fine particles and the tin ions. Specifically, when the tin fine particles and the tin ions react with hydrogen, tin becomes stannane ($SnH_4$) gas at room temperature. Here, a supply gas amount adjustment unit (not shown) may be arranged at a pipe between the gas supply tank 74 and at least one of the first gas supply unit 72 and the second gas supply unit 73.

Further, a pair of exhaust portions 81 are arranged at the chamber 10. The exhaust portions 81 are configured to exhaust residual gas in the chamber 10. As shown in FIG. 3, exhaust ports 81E of the respective exhaust portions 81 are formed, for example, at positions facing each other on the wall of the chamber 10. The residual gas includes fine particles and charged particles generated by turning of the target substance into plasma, products generated through the reaction of the fine particles and the charged particles with the etching gas, and unreacted etching gas. Some of the charged particles are neutralized in the chamber 10, and the residual gas contains the neutralized charged particles as well. The exhaust portions 81 from which the residual gas is exhausted are connected to exhaust pipes 81P. The exhaust pipes 81P are connected to an exhaust pump 85, the residual gas exhausted from the exhaust ports 81E flows into the exhaust pump 85 through the exhaust pipes 81P, and the residual gas is subjected to predetermined exhaust treatment at the exhaust pump 85.

Further, the EUV light generation apparatus 100 includes a magnetic field generation unit 65. The magnetic field generation unit 65 is configured to generate a magnetic field ML for the charged particles generated in the plasma generation region AR to converge to the exhaust port 81E. The magnetic field generation unit 65 may, for example, be configured by a pair of electromagnets 65M arranged so as to sandwich the wall of the chamber 10 facing each other. The pair of electromagnets 65M are arranged such that the plasma generation region AR is positioned midway between the respective electromagnets 65M. The direction of the current flowing through the superconducting coil of one electromagnet 65M is the same as the direction of the current flowing through the superconducting coil of the other electromagnet 65M. When such currents are applied to a pair of the superconducting coils, the magnetic field ML is generated in which the magnetic flux density is highest in the vicinity of the respective electromagnets 65M, and the magnetic flux density becomes lower toward the plasma generation region AR. A magnetic field axis MA of the magnetic field ML preferably crosses a reflective light path of the EUV light concentrating mirror 50 and preferably passes through the plasma generation region AR. The magnetic field ML is called a mirror magnetic field in some cases.

Here, the magnetic field generation unit 65 may generate a magnetic field for the charged particles to converge from one electromagnet 65M side to the other electromagnet 65M side through the plasma generation region AR. Further, the magnetic field generation unit 65 is configured by the pair of electromagnets 65M but may be configured by a pair of permanent magnets. Further, the electromagnets 65M or the permanent magnets that are magnets for generating the magnetic field may be arranged inside the chamber 10.

Further, as described above, in the comparative example, the exhaust ports 81E are provided at positions facing each other on the wall of the chamber 10, and the charged particles are exhausted from the exhaust ports 81E. Therefore, in the example shown in FIG. 3, the pair of exhaust ports 81E are provided at positions facing each other along the magnetic field axis MA and through which the magnetic field axis MA passes in the chamber 10.

At least one of the exhaust portions 81 may be provided with a trap mechanism such as a heater for trapping fine particles.

3.2 Operation

Next, operation of the EUV light generation apparatus 100 of the comparative example will be described. In the EUV light generation apparatus 100, for example, at the time of new installation, maintenance, or the like, atmospheric air in the chamber 10 is exhausted. At this time, purging and exhausting inside the chamber 10 may be repeated for exhausting atmospheric components. For example, inert gas such as nitrogen ($N_2$) or argon (Ar) is preferably used for the purge gas. Thereafter, when the pressure in the chamber 10 becomes equal to or lower than a predetermined pressure, the control unit 20 starts introducing the etching gas from the first gas supply unit 72 and the second gas supply unit 73 into the chamber 10. At this time, the control unit 20 may control the supply gas amount adjustment unit (not shown) and the exhaust pump 85 so that the pressure at the internal space of the chamber 10 is maintained at the predetermined pressure. Thereafter, the control unit 20 waits until a predetermined time elapses from the start of introduction of the etching gas.

Further, the control unit 20 drives the electromagnets 65M of the magnetic field generation unit 65 to generate the magnetic field ML. Further, the control unit 20 causes the gas in the internal space of the chamber 10 to be exhausted from the exhaust portion 81 to the exhaust pump 85, and keeps the pressure at the internal space of the chamber 10 substantially constant based on the signal of the pressure at the internal space of the chamber 10 measured by the pressure sensor 26. At this time, the pressure at the internal space of the chamber 10 is, for example, in the range of 10 Pa to 160 Pa.

In order to heat and maintain the target substance in the tank 41 at a predetermined temperature equal to or higher than the melting point, the control unit 20 causes the heater power source 45 to apply current to the heater 44 to increase temperature of the heater 44. At this time, based on the output from a temperature sensor (not shown), an amount of the current applied from the heater power source 45 to the heater 44 is adjusted to control the temperature of the target substance to a predetermined temperature. The predetermined temperature is, for example, in the range of 250° C. to 290° C. when tin is used as the target substance.

Further, the control unit 20 causes the pressure adjuster 43 to control the pressure in the tank 41 so that the melted target substance is output through a nozzle hole of the nozzle 42 at a predetermined velocity. The target substance discharged from the hole of the nozzle 42 may be in the form of jet. At this time, the control unit 20 applies voltage having a predetermined waveform to the piezoelectric element 46 through the piezoelectric power source 47 to generate the droplet DL. Vibration of the piezoelectric element 46 can propagate via the nozzle 42 to the jet of the target substance to be output through the hole of the nozzle 42. The jet of the target substance is divided at a predetermined cycle by the vibration, and a liquid droplet DL is generated from the target substance.

Further, the control unit 20 outputs a light emission trigger to the laser device 30. When the light emission trigger is input, the laser device 30 emits the pulse laser light 301. The emitted laser light 301 is incident on the laser light concentrating optical system 13 through the laser light delivery optical system 35 and the window 12. At this time, the control unit 20 controls the laser light manipulator 13C of the laser light concentrating optical system 13 such that the laser light 301 is concentrated in the plasma generation region AR. The control unit 20 causes the laser device 30 to emit the laser light 301 based on the signal from the target sensor 27 so that the droplet DL is irradiated with the laser light 301. Thus, the droplet DL is irradiated in the plasma generation region AR with the laser light 301 converged by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 50, and then is incident on the exposure apparatus 200 from the connection portion 19. Therefore, it can be understood that the connection portion 19 is the emission port of the EUV light in the EUV light generation apparatus 100.

Here, when the target substance is turned into plasma, charged particles are generated as described above. The charged particles move on a trajectory rotating in a plane perpendicular to the magnetic field line by receiving a Lorentz force from the magnetic field ML. When the charged particles moving in this manner have velocity components in the direction to the exhaust port 81E, the charged particles are directed toward the wall of the chamber 10 while converging in a spiral trajectory along the magnetic field lines. Accordingly, most of the charged particles are guided to the exhaust port 81E provided on the wall of the chamber 10 near the converging portion of the magnetic field ML, and flow into the exhaust port 81E. The charged particles reaching the inside of the exhaust pipe 81P from the exhaust port 81E flow into the exhaust pump 85 along with airflow of the exhaust gas.

Further, when the target substance is turned into plasma, electrically neutral fine particles are generated in addition to the charged particles described above. Not being affected by the magnetic field ML generated by the magnetic field generation unit 65, the fine particles are diffused into the chamber 10. Some of the fine particles diffused into the chamber 10 adhere to a reflection surface of the EUV light concentrating mirror 50. The fine particles adhered to the reflection surface react with the etching gas supplied from the first gas supply unit 72 and the second gas supply unit 73, and become predetermined products through the reaction. As described above, when tin is used as the target substance and gas containing hydrogen is used as the etching gas, the product is stannane gas at room temperature. Most of the products generated by the reaction with the etching gas flow into the exhaust pipe 81P from the exhaust port 81E of the exhaust portion 81 along with the flow of the unreacted etching gas. Further, at least some of the charged particles not converged to the exhaust port 81E and the fine particles not adhered to the reflection surface of the EUV light concentrating mirror 50 may react with some of the unreacted etching gas flowing in the chamber 10. Most of the products generated by the reaction flow into the exhaust pipe 81P from the exhaust port 81E along with the flow of the unreacted etching gas. At least some of the unreacted etching gas flows into the exhaust pipe 81P from the exhaust port 81E.

The unreacted etching gas, fine particles, charged particles, neutralized charged particles, the above-mentioned products, and the like, which have flowed into the exhaust port 81E of the exhaust portion 81, flow from the exhaust pipe 81P into the exhaust pump 85 as exhaust gas and are subjected to predetermined exhaust treatment such as detoxification.

3.3 Problem

Most of the charged particles and fine particles generated by turning of the droplet DL into plasma are discharged from the exhaust port 81E as described above. However, some of the charged particles and fine particles in the chamber 10 remain in the chamber 10 without being discharged from the exhaust port 81E in some cases. When the charged particles remain in the chamber 10, the charged particles tend to be neutralized. Further, the charged particles remaining in the chamber 10 may collide with the fine particles in the chamber 10 to generate new fine particles. When the fine particles remain in the chamber 10, there is a strong tendency for the fine particles to deposit on the reflection surface 55 of the EUV light concentrating mirror 50. Consequently, there may arise a problem that the reflectance of the EUV light concentrating mirror 50 is reduced. When the reflectance of the EUV light concentrating mirror 50 is reduced, there is a fear that output of the EUV light from the EUV light generation apparatus 100 is reduced.

Therefore, in the following embodiments, an extreme ultraviolet light generation apparatus capable of suppressing decrease in reflectance of EUV light is exemplified.

4. Description of Extreme Ultraviolet Light Generation Apparatus of First Embodiment Next, the configuration of an extreme ultraviolet light generation apparatus of a first embodiment will be described. Any component same as that described above is denoted by an identical reference sign, and duplicate description thereof is omitted unless specific description is needed.

4.1 Configuration

Figure 4:
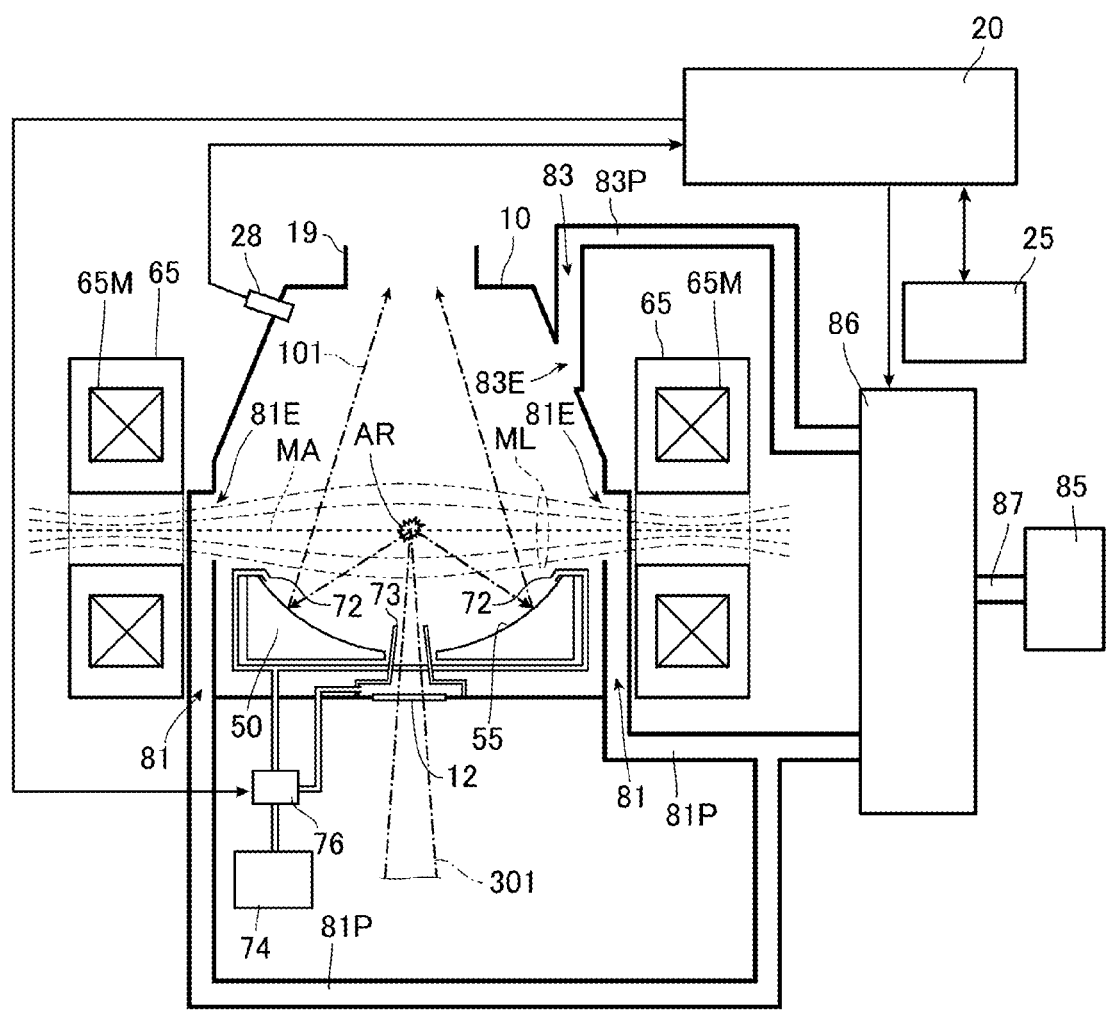
FIG. 4 is a schematic view showing a schematic configuration of a part including the chamber of the EUV light generation apparatus of a first embodiment.

FIG. 4 is a schematic view showing a schematic configuration of a part including the chamber 10 of the EUV light generation apparatus 100 in the present embodiment. In FIG. 4, similarly to FIG. 3, the laser light concentrating optical system 13 is omitted. The chamber 10 of the present embodiment is mainly different from the chamber 10 of the comparative example in that a second exhaust portion 83 is provided. In the following description, the exhaust portion 81 described in the comparative example is referred to as a first exhaust portion 81, the exhaust port 81E is referred to as a first exhaust port 81E, and the exhaust pipe 81P is referred to as a first exhaust pipe 81P. In the present embodiment, since the first exhaust portion 81 and the second exhaust portion 83 are provided, the residual gas in the chamber 10 is exhausted as the first exhaust gas from the first exhaust portion 81 and exhausted as the second exhaust gas from the second exhaust portion 83.

As shown in FIG. 4, the second exhaust portion 83 includes a second exhaust port 83E. The second exhaust port 83E is arranged at a position opposite to the EUV light concentrating mirror 50 in the chamber 10 with respect to a plane passing through the first exhaust port 81E and being perpendicular to the optical axis of the EUV light concentrating mirror 50. The pair of first exhaust ports 81E are arranged at positions through which the magnetic field axis MA passes in the chamber 10 as described above. Therefore, the second exhaust port 83E is arranged on a side close to the connection portion 19 being the emission port of the EUV light not on a side close to the plasma generation region AR, provided that the magnetic field axis MA crosses the reflected light path of the EUV light concentrating mirror 50 as passing through the plasma generation region AR.

The second exhaust port 83E is connected to the second exhaust pipe 83P. The second exhaust pipe 83P is connected to a gas exhaust amount adjustment unit 86. Further, in the present embodiment, the first exhaust pipe 81P is also connected to the gas exhaust amount adjustment unit 86, similarly to the second exhaust pipe 83P. The gas exhaust amount adjustment unit 86 is connected to an exhaust pipe 87. The exhaust pipe 87 is connected to the exhaust pump 85.

The gas exhaust amount adjustment unit 86 adjusts the ratio between the first exhaust gas exhausted from the first exhaust pipe 81P to the exhaust pipe 87 and the second exhaust gas exhausted from the second exhaust pipe 83P to the exhaust pipe 87. As described above, the first exhaust pipe 81P is connected to the first exhaust port 81E, and the second exhaust pipe 83P is connected to the second exhaust port 83E. Therefore, the gas exhaust amount adjustment unit 86 adjusts the ratio between the first exhaust gas exhausted from the first exhaust port 81E and the second exhaust gas exhausted from the second exhaust port 83E.

In the present embodiment, when a path through which the first exhaust gas flows and through which the flow of the second exhaust gas is suppressed is referred to as a first exhaust path, a path from the first exhaust port 81E to the gas exhaust amount adjustment unit 86 corresponds to the first exhaust path. Further, when a path through which the second exhaust gas flows and through which the flow of the first exhaust gas is suppressed is referred to as a second exhaust path, a path from the second exhaust port 83E to the gas exhaust amount adjustment unit 86 corresponds to the second exhaust path.

The exhaust pump 85 is a pump for exhausting gas from the exhaust pipe 87. Accordingly, the exhaust pump 85 exhausts a part of the residual gas in the chamber 10 from the first exhaust port 81E to the first exhaust pipe 81P as the first exhaust gas, and exhausts another part of the residual gas from the second exhaust port 83E to the second exhaust pipe 83P as the second exhaust gas, through the exhaust pipe 87 and the gas exhaust amount adjustment unit 86.

Further, in the present embodiment, the supply gas amount adjustment unit 76 is arranged in the pipe between the gas supply tank 74 and the first gas supply unit 72 and in the pipe between the gas supply tank 74 and the second gas supply unit 73. The supply gas amount adjustment unit 76 adjusts the flow rate of the etching gas flowing from the gas supply tank 74 to the first gas supply unit 72 and the flow rate of the etching gas flowing from the gas supply tank 74 to the second gas supply unit 73.

In addition, in the present embodiment, the chamber 10 is provided with an EUV light measurement unit 28. The EUV light measurement unit 28 detects the intensity of part of the EUV light radiated from the plasma generation region AR among the light generated in the plasma generation region AR, and outputs a signal corresponding to the intensity.

Further, in the present embodiment, the EUV light measurement unit 28, the gas exhaust amount adjustment unit 86, and the supply gas amount adjustment unit 76 are connected to the control unit 20. In the present embodiment, the control unit 20 controls the gas exhaust amount adjustment unit 86 and the supply gas amount adjustment unit 76 in addition to the operation in the comparative example.

A memory 25 is connected to the control unit 20. The memory 25 stores a table in which the amount of the etching gas supplied from the first gas supply unit 72 and the amount of the etching gas supplied from the second gas supply unit 73 are associated with each other. The amount of the etching gas is determined based on the intensity of the laser light 301 emitted from the laser device 30. Therefore, the memory 25 further stores a table in which the intensity of the laser light 301 and the amount of the etching gas supplied into the chamber 10 are associated with each other. In the present embodiment, the higher the intensity of the laser light 301, the larger the amount of the etching gas supplied into the chamber 10. In the present embodiment, the amount of the etching gas supplied from the first gas supply unit 72 is constant regardless of the intensity of the laser light 301. Therefore, only the amount of the etching gas supplied from the second gas supply unit 73 in accordance with the intensity of the laser light 301 may be stored in the table stored in the memory 25. Here, unlike the present embodiment, the amount of the etching gas supplied from the first gas supply unit 72 may vary in accordance with the intensity of the laser light 301.

The memory 25 stores the ratio between the amount of the first exhaust gas exhausted from the first exhaust portion 81 and the amount of the second exhaust gas exhausted from the second exhaust portion 83. The ratio is determined based on the amount of the etching gas supplied into the chamber 10. Accordingly, the memory 25 stores a table in which the amount of the etching gas and the ratio are associated with each other. For example, the ratio of the amount of the first exhaust gas to the amount of the second exhaust gas is determined to be 70%:30% to 30%:70%.

4.2 Operation

Figure 5:
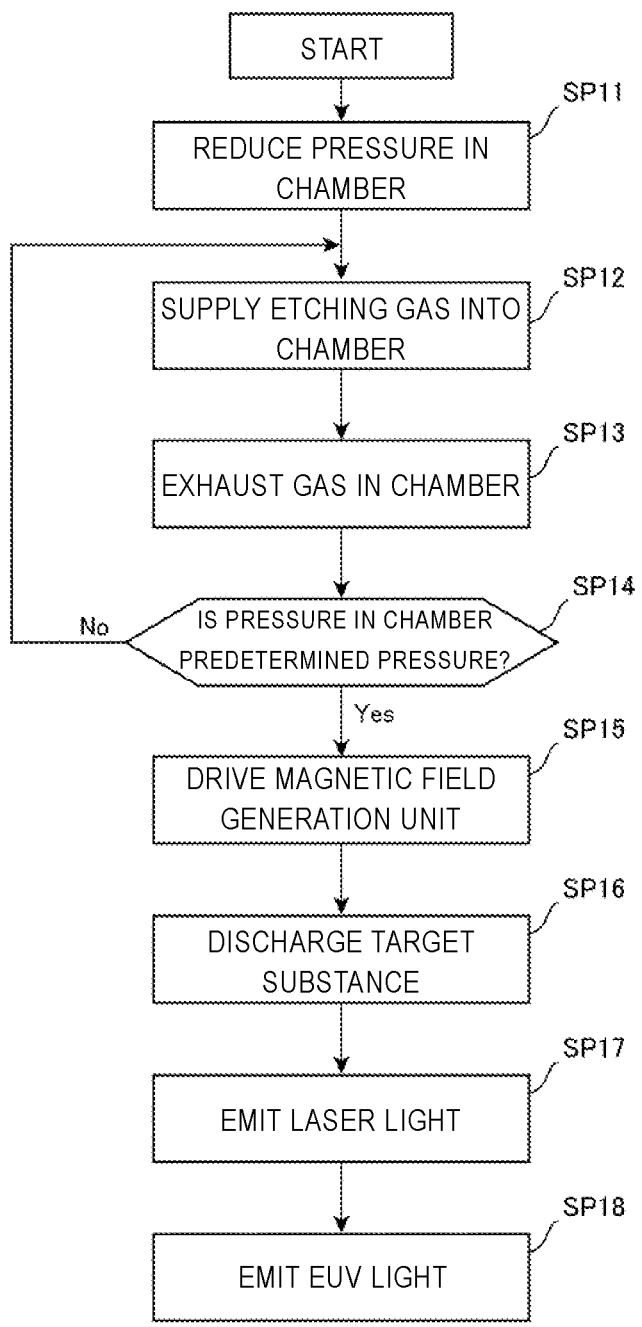
FIG. 5 is a flowchart showing operation of a control unit from an initial state until the EUV light generation apparatus emits EUV light.

Next, operation of the EUV light generation apparatus 100 of the present embodiment will be described. FIG. 5 is a flowchart showing operation of the control unit 20 from an initial state until the EUV light generation apparatus 100 emits EUV light.

(Step SP11)

Similarly to the comparative example, for example, at the time of new introduction, maintenance, or the like, the atmosphere in the chamber 10 is exhausted and the pressure in the chamber 10 is reduced in step SP11.

(Step SP12)

When the pressure in the chamber 10 becomes equal to or lower than a predetermined pressure defined as the initial state, in this step, the control unit 20 starts supplying the etching gas from the first gas supply unit 72 and the second gas supply unit 73 into the chamber 10. At this stage, the laser device 30 does not emit the laser light 301. However, in the present embodiment, the control unit 20 controls the supply gas amount adjustment unit 76 with reference to the memory 25 so that the amount of the etching gas becomes that when the laser light 301 is emitted from the laser device 30 at predetermined intensity in step SP17 described later. At this time, the control unit 20 controls the supply gas amount adjustment unit 76 with reference to the memory 25 so that the ratio between the amount of the etching gas supplied from the first gas supply unit 72 and the amount of the etching gas supplied from the second gas supply unit 73 becomes a predetermined ratio. The supply gas amount adjustment unit 76 adjusts the amount of the etching gas supplied from the first gas supply unit 72 and the amount of the etching gas supplied from the second gas supply unit 73, based on the control signal from the control unit 20.

(Step SP13)

In this step, the control unit 20 controls the gas exhaust amount adjustment unit 86 so that the same amount of gas as the amount of the etching gas supplied into the chamber 10 is exhausted. At this time, the control unit 20 refers to the table stored in the memory 25 and controls the gas exhaust amount adjustment unit 86 so that the ratio between the amount of the first exhaust gas and the amount of the second exhaust gas becomes a predetermined ratio. As described above, the ratio between the amount of the first exhaust gas and the amount of the second exhaust gas is determined based on the amount of the etching gas supplied into the chamber 10. Thus, the predetermined ratio at this time corresponds to the ratio between the amounts of the etching gas supplied into the chamber 10 when the laser light 301 is emitted from the laser device 30 at the predetermined intensity in step SP17 described later.

(Step SP14)

In this step, based on the signal from the pressure sensor 26, the control unit 20 proceeds to step SP15 when the pressure in the chamber 10 is within a predetermined pressure range, and returns to step SP12 when the pressure in the chamber 10 is not within the predetermined pressure range. At this time, the pressure at the internal space of the chamber 10 is, for example, in the range of 10 Pa to 160 Pa.

(Step SP15)

In this step, similarly to the comparative example, the control unit 20 drives the electromagnets 65M of the magnetic field generation unit 65 to generate the magnetic field ML.

(Step SP16)

In this step, similarly to the comparative example, the control unit 20 controls the pressure in the tank 41 by the pressure adjuster 43 so that the molten target substance is output from the nozzle hole of the nozzle 42 at a predetermined velocity.

(Step SP17)

In this step, similarly to the comparative example, the control unit 20 outputs the light emission trigger to the laser device 30. When the emission trigger is input, the laser device 30 emits the pulse laser light 301 having predetermined intensity. Similarly to the comparative example, the emitted laser light 301 is concentrated in the plasma generation region AR and is radiated to the droplet DL 301. At this time, the amount of the etching gas supplied from the first gas supply unit 72 and the amount of the etching gas supplied from the second gas supply unit 73 remain the same as the amounts of the etching gas supplied in step SP12.

(Step SP18)

In this step, light including EUV light is radiated from the plasma generated through the irradiation of the droplet DL with the laser light 301 in step SP17. Similarly to the comparative example, the EUV light 101 among the light including the EUV light generated in the plasma generation region AR enters the exposure apparatus 200 from the connection portion 19.

Figure 6:
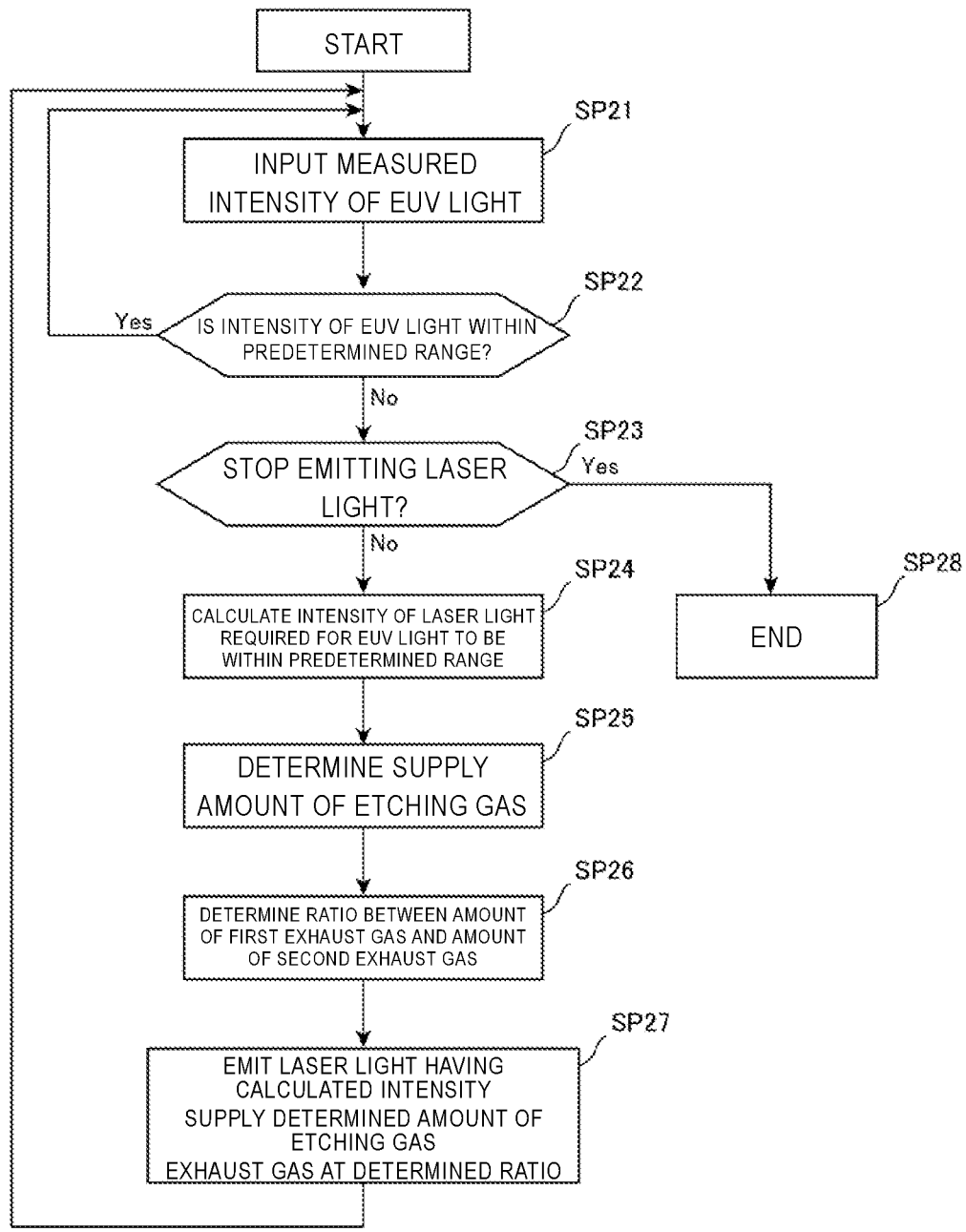
FIG. 6 is a flowchart showing operation of the control unit in a state that the EUV light is emitted from the EUV light generation apparatus.

Next, description will be provided on operation of the EUV light generation apparatus 100 in a state that the EUV light 101 is emitted from the EUV light generation apparatus 100. FIG. 6 is a flowchart showing operation of the control unit 20 in a state that the EUV light 101 is emitted from the EUV light generation apparatus 100.

(Step SP21)

The state in which the EUV light 101 is emitted from the EUV light generation apparatus 100 in step SP18 of FIG. 5 is a state of start shown in FIG. 6. In this step, the intensity of the EUV light 101 emitted from the EUV light generation apparatus 100 is measured. Specifically, the EUV light measurement unit 28 detects the intensity of part of the EUV light radiated from the plasma generation region AR among the light generated in the plasma generation region AR, and outputs a signal corresponding to the intensity. The output signal is input to the control unit 20. The intensity of the EUV light measured by the EUV light measurement unit 28 differs from the intensity of the EUV light 101 output from the connection portion 19 of EUV light generation apparatus 100. However, the intensity of the EUV light radiated from the plasma generation region AR and detected by the EUV light measurement unit 28 is correlated with the intensity of the EUV light 101 output from the connection portion 19 of the EUV light generation apparatus 100. Therefore, in the present embodiment, using the intensity of the EUV light radiated from the plasma generation region AR and detected by the EUV light measurement unit 28, the intensity of the EUV light 101 output from the connection portion 19 of the EUV light generation apparatus 100 is measured.

(Step SP22)

In this step, the control unit 20 determines whether or not the intensity of the EUV light 101 output from the connection portion 19 is within a predetermined range using the signal input from the EUV light measurement unit 28. The control unit 20 may perform the above determination by calculating the intensity of the EUV light 101 output from the connection portion 19 of the EUV light generation apparatus 100 using the signal input from the EUV light measurement unit 28. Alternatively, the control unit 20 determines whether or not the intensity of the EUV light detected by the EUV light measurement unit 28 is within a predetermined range, and whether or not the intensity of the EUV light 101 output from the connection portion 19 is within the predetermined range based on the above determination. When the intensity of the EUV light 101 is within the predetermined range, there is no need to change the EUV light 101 output from the connection portion 19 of the EUV light generation apparatus 100. Therefore, there is no need to change the laser light 301 emitted from the laser device 30. In this case, the control unit 20 returns to step SP21, and receives a signal output from the EUV light measurement unit 28. On the other hand, when the control unit 20 determines that the intensity of the EUV light 101 is not within the predetermined range, the control unit 20 proceeds to step SP23.

(Step SP23)

In this step, the control unit 20 determines whether or not to stop emitting the laser light 301 from the laser device 30. In step SP22, the control unit 20 determines whether or not the difference of the intensity of the EUV light 101 output from the connection portion 19 from the above predetermined range is equal to or greater than a certain intensity. When the difference of the intensity of the EUV light 101 from the predetermined range is equal to or greater than the certain intensity, that is, when the intensity of the EUV light 101 output from the connection portion 19 differs greatly from the assumed range, there is a possibility that some failure has occurred in the EUV light generation apparatus 100. In this case, the control unit 20 controls the laser device 30 to stop emitting the laser light 301 therefrom and proceeds to step SP28. In step SP28, the EUV light generation apparatus 100 is stopped. On the other hand, when the control unit 20 determines that the difference of the intensity of the EUV light 101 from the predetermined range is less than the certain intensity, the control unit 20 proceeds to step SP24.

(Step SP24)

In this step, the control unit 20 calculates the intensity of the laser light 301 emitted from laser device 30 required for the intensity of the EUV light 101 to be within the predetermined range. For example, as described above, when the target substance is turned into plasma, particles such as charged particles and electrically neutral fine particles are generated, and some of these particles may adhere to the reflection surface of the EUV light concentrating mirror 50. Then, there may be a case that the intensity of the EUV light 101 output from the connection portion 19 falls below the predetermined range while the reflectance of the EUV light concentrating mirror 50 is decreased. When the intensity of the EUV light 101 is lower than the predetermined range, the control unit 20 performs the calculation to increase the intensity of the laser light 301. On the other hand, when the intensity of the EUV light 101 is higher than the predetermined range, the control unit 20 performs the calculation to decrease the intensity of the laser light 301. Thus, the intensity of the laser light 301 to set the intensity of the EUV light 101 within the predetermined range is obtained.

(Step SP25)

In this step, based on the intensity of the laser light 301 calculated in step SP24, the amount of the etching gas to be supplied is determined. In the case that the intensity of the laser light 301 is increased, charged particles, electrically neutral fine particles, and the like tend to be emitted more when the laser light 301 is radiated to the target substance. Therefore, when the intensity of the laser light 301 is increased, the amount of the etching gas supplied from the second gas supply unit 73 is increased, and when the intensity of the laser light 301 is decreased, the amount of the etching gas supplied from the second gas supply unit 73 is decreased. As described above, in the present embodiment, the amount of the gas supplied from the first gas supply unit 72 is constant regardless of the intensity of the laser light 301. Accordingly, in this step, the amount of the etching gas supplied from the second gas supply unit 73 is determined based on the table stored in the memory 25. Therefore, in this step, the ratio between the amount of the gas supplied from the first gas supply unit 72 and the amount of the etching gas supplied from the second gas supply unit 73 is consequently determined.

(Step SP26)

In this step, based on the amount of the etching gas determined in step SP25, the ratio between the amount of the first exhaust gas exhausted from the first exhaust portion 81 and the amount of the second exhaust gas exhausted from the second exhaust portion 83 is determined. The control unit 20 determines the ratio by reading out from the table in which the ratio is associated with the amount of the etching gas in the memory 25. When the memory 25 does not store such a table, the control unit 20 may calculate the ratio from the amount of the etching gas based on a predetermined algorithm.
(Step SP27)

In this step, the control unit 20 controls the laser device 30 so that the laser light 301 having the intensity calculated in step SP24 is emitted from the laser device 30. Thus, the laser device 30 emits the pulse laser light 301 having the intensity calculated in step SP24. The laser light 301 having the new intensity is concentrated in the plasma generation region AR and radiated to the target substance. Accordingly, the EUV light 101 having the intensity within the predetermined range is output from the connection portion 19. For example, when the reflectance of the EUV light concentrating mirror 50 is decreased, the new intensity of the laser light 301 will be greater than the previous intensity of the laser light 301, and the total amount of the EUV light radiated from the plasma generation region AR is increased. Therefore, even when the reflectance of the EUV light concentrating mirror 50 is decreased, the EUV light 101 having the intensity within the predetermined range can be output from the connection portion 19.

Further, in this step, the control unit 20 controls the supply gas amount adjustment unit 76 so that the amount of the etching gas to be supplied from the second gas supply unit 73 determined in step SP25 is supplied from the second gas supply unit 73. The supply gas amount adjustment unit 76 supplies the etching gas from the second gas supply unit 73 based on the control of the control unit 20. For example, when the new intensity of the laser light 301 is greater than the previous intensity of the laser light 301, the amount of the etching gas supplied from the second gas supply unit 73 is set greater than the amount of the etching gas previously supplied from the second gas supply unit 73.

Further, in this step, the control unit 20 controls the gas exhaust amount adjustment unit 86 so that the ratio between the amount of the first exhaust gas exhausted from the first exhaust portion 81 and the amount of the second exhaust gas exhausted from the second exhaust portion 83 becomes the ratio determined in step SP26. Accordingly, the first exhaust gas and the second exhaust gas are exhausted from the first exhaust portion 81 and the second exhaust portion 83 at the ratio determined in step SP26. The first exhaust gas and the second exhaust gas exhausted as described above are exhausted to the exhaust pump 85 through the exhaust pipe 87. Here, the control unit 20 controls the gas exhaust amount adjustment unit 86 so that the total amount of the first exhaust gas and the second exhaust gas is equal to the total amount of the etching gas supplied from the first gas supply unit 72 and the second gas supply unit 73, as described above. Accordingly, the pressure in the chamber 10 is maintained substantially constant.

Next, returning to step SP21, the intensity of the EUV light measured by the EUV light measurement unit 28 is input to the control unit 20.
4.3 Effect In the present embodiment, the first exhaust port 81E is arranged at a position through which the magnetic field axis MA passes in the chamber 10. Further, the second exhaust port 83E is arranged at a position opposite to the EUV light concentrating mirror 50 in the chamber 10 with respect to a plane passing through the first exhaust port 81E and being perpendicular to the optical axis of the EUV light concentrating mirror 50. Further, the EUV light generation apparatus 100 includes the gas exhaust amount adjustment unit 86 that adjusts the ratio between the exhaust amount of the first exhaust gas exhausted from the first exhaust port 81E and the exhaust amount of the second exhaust gas exhausted from the second exhaust port 83E.

Therefore, compared with the case where the first exhaust port 81E is arranged in the chamber 10 and the second exhaust port 83E is not arranged as in the EUV light generation apparatus 100 of the comparative example, it is possible to make it easier for the residual gas in the chamber 10 to flow toward the side opposite to the EUV light concentrating mirror 50. Further, the gas exhaust amount adjustment unit 86 adjusts the ratio between the exhaust amount of the first exhaust gas exhausted from the first exhaust port 81E and the exhaust amount of the second exhaust gas exhausted from the second exhaust port 83E. Accordingly, it is possible to adjust the amount of the residual gas in the chamber 10 flowing toward the side opposite to the EUV light concentrating mirror 50. Thus, as compared with the EUV light generation apparatus 100 of the comparative example, it is possible to suppress contamination of the EUV light concentrating mirror 50 with fine particles generated at the time of EUV light generation, and it is possible to suppress decrease in reflectance of EUV light.

Further, in the EUV light generation apparatus 100 of the present embodiment, the pair of first exhaust ports 81E are arranged at the chamber 10 at positions facing each other along the magnetic field axis MA. Therefore, charged particles flowing toward the wall of the chamber 10 can be effectively exhausted from the first exhaust port 81E while converging in a spiral trajectory along the magnetic field lines. Although the first exhaust ports 81E are arranged as a pair in the present embodiment, for example, one first exhaust port 81E may be arranged in the chamber 10.

Further, in the EUV light generation apparatus 100, the control unit 20 controls the gas exhaust amount adjustment unit 86 to adjust the ratio between the exhaust amount of the first exhaust gas and the exhaust amount of the second exhaust gas based on the amount of the etching gas supplied into the chamber 10. When the amount of the etching gas supplied into the chamber 10 varies, the flow of the gas in the chamber 10 is changed. Owing to that the control unit 20 controls the gas exhaust amount adjustment unit 86 to adjust the ratio based on the amount of the etching gas supplied into the chamber 10, the amount of the residual gas in the chamber 10 flowing toward the side opposite to the EUV light concentrating mirror 50 can be more appropriately adjusted.

Further, in the EUV light generation apparatus 100 of the present embodiment, the control unit 20 controls the supply gas amount adjustment unit 76 to adjust the amount of the etching gas supplied into the chamber 10 based on the intensity of the laser light 301. When the intensity of the laser light 301 is high, fine particles are more easily scattered from the target substance irradiated with the laser light 301 than when the intensity of the laser light 301 is low. Therefore, by adjusting the amount of the etching gas supplied into the chamber 10 based on the intensity of the laser light 301, the residual gas containing the scattered fine particles can be more effectively exhausted from the chamber 10.

Further, in the EUV light generation apparatus 100 of the present embodiment, the control unit 20 controls the supply gas amount adjustment unit 76 to adjust the amount of the etching gas supplied from the second gas supply unit 73. The second gas supply unit 73 supplies the etching gas in a direction away from the EUV light concentrating mirror 50. Accordingly, by adjusting the amount of the etching gas supplied from the second gas supply unit 73, the amount of the fine particles scattered from the target substance toward the EUV light concentrating mirror 50 can be appropriately reduced. Here, the second gas supply unit 73 may supply the etching gas in a direction other than the direction away from the EUV light concentrating mirror 50.

Although the etching gas is described as an example in the above description, the gas supplied from the first gas supply unit 72 and the second gas supply unit 73 is not limited to the etching gas, and may be, for example, inert gas, mixed gas of etching gas and inert gas, or the like.

5. Description of Extreme Ultraviolet Light Generation Apparatus of Second Embodiment Next, an extreme ultraviolet light generation apparatus of a second embodiment will be described. Any component same as that described above is denoted by an identical reference sign, and duplicate description thereof is omitted unless specific description is needed.

5.1 Configuration

Figure 7:
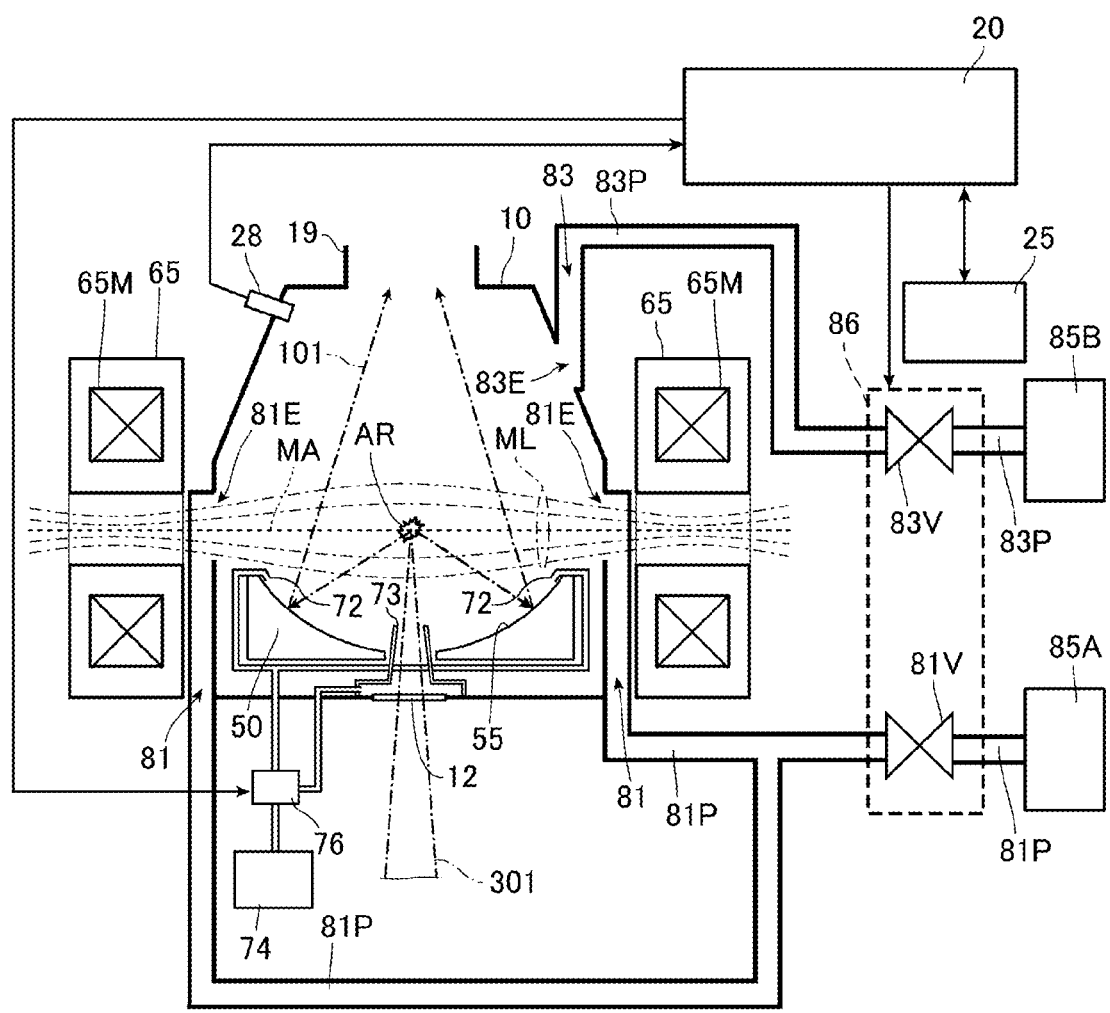
FIG. 7 is a schematic view showing a schematic configuration of a part including the chamber of the EUV light generation apparatus of a second embodiment.

FIG. 7 is a schematic view showing a schematic configuration of a part including the chamber 10 of the EUV light generation apparatus 100 in the present embodiment in the same manner as FIG. 4. As shown in FIG. 7, in the EUV light generation apparatus 100 of the present embodiment, a first exhaust pump 85A that exhausts the first exhaust gas from the first exhaust port 81E is connected to the first exhaust pipe 81P and a first valve 81V is arranged in the first exhaust pipe 81P. Further, in the EUV light generation apparatus 100 of the present embodiment, a second exhaust pump 85B that exhausts the second exhaust gas from the second exhaust port 83E is connected to the second exhaust pipe 83P and a second valve 83V is arranged in the second exhaust pipe 83P. Here, as described in the first embodiment, a path through which the first exhaust gas flows and through which the flow of the second exhaust gas is suppressed is referred to as the first exhaust path, and a path through which the second exhaust gas flows and through which the flow of the first exhaust gas is suppressed is referred to as the second exhaust path. In the present embodiment, the path from the first exhaust port 81E to the first exhaust pump 85A corresponds to the first exhaust path, and the path from the second exhaust port 83E to the second exhaust pump 85B corresponds to the second exhaust path. Accordingly, the first valve 81V is arranged in the first exhaust path and the second valve 83V is arranged in the second exhaust path. Further, in the present embodiment, the gas exhaust amount adjustment unit 86 includes the first valve 81V and the second valve 83V. The opening of the first valve 81V and the opening of the second valve 83V are controlled by the control unit 20.

5.2 Operation

The EUV light generation apparatus 100 of the present embodiment operates in the same manner as the EUV light generation apparatus 100 of the first embodiment described with reference to FIGS. 5 and 6. However, in the present embodiment, the ratio between the first exhaust gas and the second exhaust gas in step SP13 and step SP27 is adjusted by the first valve 81V and the second valve 83V, each opening of which is controlled by the control unit 20.

5.3 Effect

In the EUV light generation apparatus 100 of the present embodiment, due to the opening of the first valve 81V and the opening of the second valve 83V, it is possible to adjust the ratio between the amount of the first exhaust gas exhausted from the first exhaust port 81E and the amount of the second exhaust gas exhausted from the second exhaust port 83E. Thus, the ratio can be finely adjusted. Further, the first exhaust pump 85A is connected to the first exhaust pipe 81P and the second exhaust pump 85B is connected to the second exhaust pipe 83P. That is, the first exhaust path and the second exhaust path are independently connected to the exhaust pumps, respectively. Therefore, when the amount of the first exhaust gas is adjusted, the influence thereof on the amount of the second exhaust gas can be suppressed, and when the amount of the second exhaust gas is adjusted, the influence thereof on the amount of the first exhaust gas can be suppressed.

6. Description of Extreme Ultraviolet Light Generation Apparatus of Third Embodiment Next, an extreme ultraviolet light generation apparatus of a third embodiment will be described. Any component same as that described above is denoted by an identical reference sign, and duplicate description thereof is omitted unless specific description is needed.

6.1 Configuration

Figure 8:
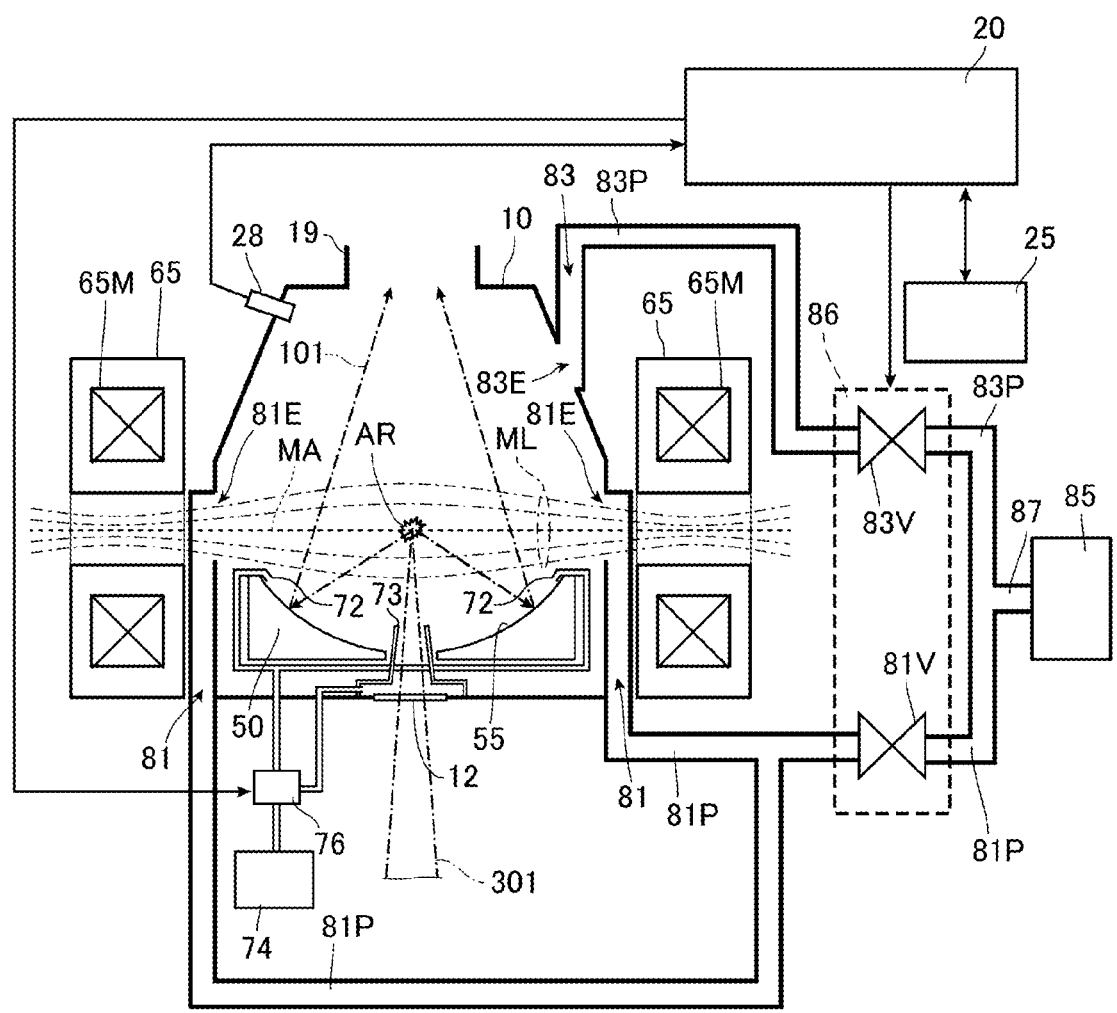
FIG. 8 is a schematic view showing a schematic configuration of a part including the chamber of the EUV light generation apparatus of a third embodiment.

FIG. 8 is a schematic view showing a schematic configuration of a part including the chamber 10 of the EUV light generation apparatus 100 of the present embodiment in the same manner as FIG. 4. As shown in FIG. 8, in the EUV light generation apparatus 100 of the present embodiment, the first exhaust pipe 81P connected to the first exhaust port 81E and the second exhaust pipe 83P connected to the second exhaust port 83E are connected respectively to one end of the exhaust pipe 87, and the other end of the exhaust pipe 87 is connected to the exhaust pump 85. Here, as described in the first embodiment, a path through which the first exhaust gas flows and through which the flow of the second exhaust gas is suppressed is referred to as the first exhaust path, and a path through which the second exhaust gas flows and through which the flow of the first exhaust gas is suppressed is referred to as the second exhaust path. In this case, in the present embodiment, the path from the first exhaust port 81E to the front of the exhaust pipe 87 corresponds to the first exhaust path, and the path from the second exhaust port 83E to the front of the exhaust pipe 87 corresponds to the second exhaust path. Further, similarly to the second embodiment, the first valve 81V and the second valve 83V are arranged in the first exhaust pipe 81P and the second exhaust pipe 83P, respectively. Accordingly, in the present embodiment as well, the first valve 81V is arranged in the first exhaust path and the second valve 83V is arranged in the second exhaust path. Further, in the present embodiment, similarly to the second embodiment, the gas exhaust amount adjustment unit 86 includes the first valve 81V and the second valve 83V. The opening of the first valve 81V and the opening of the second valve 83V are controlled by the control unit 20.

6.2 Operation

Similarly to the second embodiment, the EUV light generation apparatus 100 of the present embodiment operates similarly to the EUV light generation apparatus 100 of the first embodiment described with reference to FIGS. 5 and 6. However, in the present embodiment, the first exhaust gas from the first exhaust port 81E and the second exhaust gas from the second exhaust port 83E are exhausted by the exhaust pump 85.

6.3 Effect

Similarly to the second embodiment, in the EUV light generation apparatus 100 of the present embodiment, due to the opening of the first valve 81V and the opening of the second valve 83V, it is possible to adjust the ratio between the amount of the first exhaust gas exhausted from the first exhaust port 81E and the amount of the second exhaust gas exhausted from the second exhaust port 83E. Thus, the ratio can be finely adjusted. Further, the first exhaust gas and the second exhaust gas are exhausted commonly by the exhaust pump 85. Therefore, compared with the EUV light generation apparatus 100 of the second embodiment, the configuration can be simplified.

7. Description of Extreme Ultraviolet Light Generation Apparatus of Fourth Embodiment Next, an extreme ultraviolet light generation apparatus of a fourth embodiment will be described. Any component same as that described above is denoted by an identical reference sign, and duplicate description thereof is omitted unless specific description is needed.

7.1 Configuration

Figure 9:
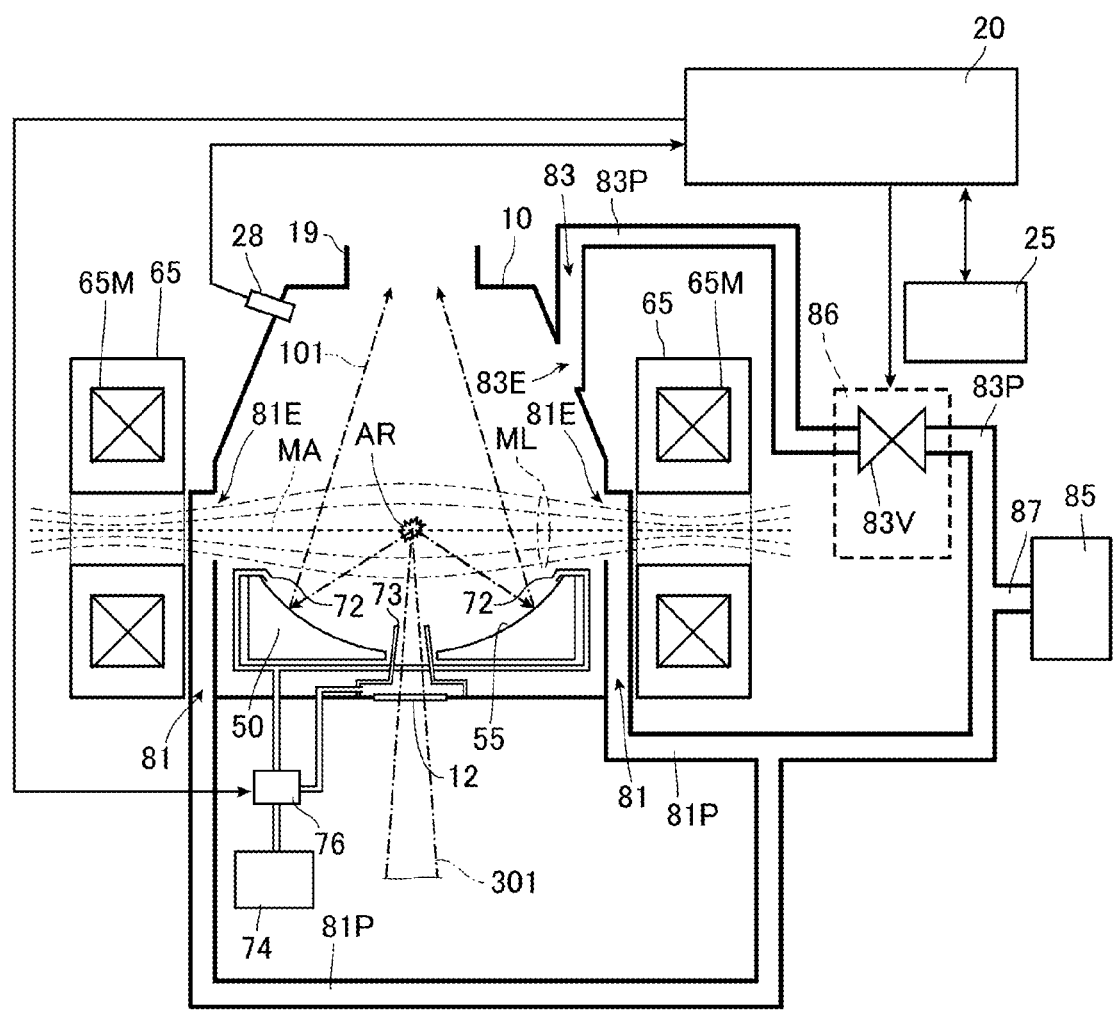
FIG. 9 is a schematic view showing a schematic configuration of a part including the chamber of the EUV light generation apparatus of a fourth embodiment.

FIG. 9 is a schematic view showing a schematic configuration of a part including the chamber 10 of the EUV light generation apparatus 100 of the present embodiment in the same manner as FIG. 4. As shown in FIG. 9, in the EUV light generation apparatus 100 of the present embodiment, similarly to the EUV light generation apparatus 100 of the third embodiment, the first exhaust pipe 81P connected to the first exhaust port 81E and the second exhaust pipe 83P connected to the second exhaust port 83E are connected respectively to one end of the exhaust pipe 87. Here, as described in the first embodiment, a path through which the first exhaust gas flows and through which the flow of the second exhaust gas is suppressed is referred to as the first exhaust path, and a path through which the second exhaust gas flows and through which the flow of the first exhaust gas is suppressed is referred to as the second exhaust path. In the present embodiment, the path from the first exhaust port 81E to the front of the exhaust pipe 87 corresponds to the first exhaust path, and the path from the second exhaust port 83E to the front of the exhaust pipe 87 corresponds to the second exhaust path. The other end of the exhaust pipe 87 is connected to the exhaust pump 85. Further, similarly to the second embodiment and the third embodiment, the second valve 83V is arranged in the second exhaust pipe 83P. Accordingly, in the present embodiment, the second valve 83V is arranged in the second exhaust path. However, in the present embodiment, no valve is arranged in the first exhaust pipe 81P. Accordingly, no valve is arranged in the first exhaust path. In the present embodiment, the gas exhaust amount adjustment unit 86 includes the second valve 83V. The opening of the second valve 83V is controlled by the control unit 20.

7.2 Operation

Similarly to the second embodiment, the EUV light generation apparatus 100 of the present embodiment operates similarly to the EUV light generation apparatus 100 of the first embodiment described with reference to FIGS. 5 and 6. However, in the present embodiment, in steps SP13 and SP27, the ratio between the first exhaust gas exhausted from the first exhaust port 81E and the second exhaust gas exhausted from the second exhaust port 83E is adjusted by the second valve 83V, the openings of which are controlled by the control unit 20. Since no valve is arranged in the first exhaust path, the amount of the first exhaust gas exhausted from the first exhaust port 81E is substantially constant.

7.3 Effect

In the EUV light generation apparatus 100 of the present embodiment, the first exhaust gas and the second exhaust gas are exhausted commonly by the exhaust pump 85. Therefore, similarly to the EUV light generation apparatus 100 of the third embodiment, the configuration can be simplified. Further, in the present embodiment, although the second valve 83V is arranged in the second exhaust path, the EUV light generation apparatus 100 may have a simpler configuration since no valve is arranged in the first exhaust path.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus, comprising:
    a chamber configured to cause a target substance to be turned into plasma with laser light radiated to a plasma generation region at an internal space of the chamber;
    a light concentrating mirror configured to concentrate extreme ultraviolet light generated by the turning of the target substance into plasma;
    a gas supply unit configured to supply gas into the chamber;
    a magnetic field generation unit configured to generate a magnetic field including a magnetic field axis that crosses a light path of the extreme ultraviolet light;
    a first exhaust port arranged at a position through which the magnetic field axis passes in the chamber;
    a second exhaust port arranged at a position opposite to the light concentrating mirror in the chamber with reference to a plane passing through the first exhaust port and being perpendicular to an optical axis of the light concentrating mirror; and
    a gas exhaust amount adjustment unit configured to adjust a ratio between an exhaust amount of first exhaust gas exhausted from the first exhaust port and an exhaust amount of second exhaust gas exhausted from the second exhaust port.

2. The extreme ultraviolet light generation apparatus according to claim 1,
    wherein a pair of the first exhaust ports are arranged, and the pair of first exhaust ports are arranged at positions facing each other along the magnetic field axis in the chamber.

3. The extreme ultraviolet light generation apparatus according to claim 1,
    wherein the gas exhaust amount adjustment unit includes a first valve arranged in a first exhaust path between the first exhaust port and a first exhaust pump that exhausts the first exhaust gas from the first exhaust port, and a second valve arranged in a second exhaust path between the second exhaust port and a second exhaust pump that exhausts the second exhaust gas from the second exhaust port.

4. The extreme ultraviolet light generation apparatus according to claim 1,
wherein the gas exhaust amount adjustment unit includes a first valve arranged in a first exhaust path, through which the first exhaust gas flows and through which flow of the second exhaust gas is suppressed, between the first exhaust port and an exhaust pump that exhausts the first exhaust gas from the first exhaust port and the second exhaust gas from the second exhaust port, and a second valve arranged in a second exhaust path, through which the second exhaust gas flows and through which flow of the first exhaust gas is suppressed, between the second exhaust port and the exhaust pump.

5. The extreme ultraviolet light generation apparatus according to claim 1,
wherein the gas exhaust amount adjustment unit includes a second valve arranged in a second exhaust path, through which the second exhaust gas flows and through which flow of the first exhaust gas is suppressed, between the second exhaust port and an exhaust pump that exhausts the first exhaust gas from the first exhaust port and the second exhaust gas from the second exhaust port, and
no valve is arranged in the first exhaust path, through which the first exhaust gas flows and through which flow of the second exhaust gas is suppressed, between the first exhaust port and the exhaust pump.

6. The extreme ultraviolet light generation apparatus according to claim 1,
further comprising a control unit configured to control the gas exhaust amount adjustment unit to adjust the ratio based on an amount of the gas supplied into the chamber.

7. The extreme ultraviolet light generation apparatus according to claim 6,
further comprising a supply gas amount adjustment unit configured to adjust an amount of the gas supplied from the gas supply unit,
wherein the control unit controls the supply gas amount adjustment unit to adjust the amount of the gas supplied into the chamber based on intensity of the laser light.

8. The extreme ultraviolet light generation apparatus according to claim 7,
wherein the gas supply unit includes a first gas supply unit configured to supply the gas along a reflection surface the light concentrating mirror from an outer periphery of the light concentrating mirror, and a second gas supply unit configured to supply the gas from a through hole formed in the light concentrating mirror, and
the control unit controls the supply gas amount adjustment unit to adjust an amount of the gas supplied from the second gas supply unit.

9. The extreme ultraviolet light generation apparatus according to claim 8,
wherein the second gas supply unit supplies the gas in a direction away from the light concentrating mirror.

10. The extreme ultraviolet light generation apparatus according to claim 1,
wherein the target substance is tin and the gas contains hydrogen.

11. An electronic device manufacturing method, comprising:
generating extreme ultraviolet light using an extreme ultraviolet light generation apparatus;
emitting the extreme ultraviolet light to an exposure apparatus; and
exposing a photosensitive substrate to the extreme ultraviolet light in the exposure apparatus to produce an electronic device,
the extreme ultraviolet light generation apparatus including:
a chamber configured to cause a target substance to be turned into plasma with laser light radiated to a plasma generation region at an internal space of the chamber;
a light concentrating mirror configured to concentrate the extreme ultraviolet light generated by the turning of the target substance into plasma;
a gas supply unit configured to supply gas into the chamber;
a magnetic field generation unit configured to generate a magnetic field including a magnetic field axis that crosses a light path of the extreme ultraviolet light;
a first exhaust port arranged at a position through which the magnetic field axis passes in the chamber;
a second exhaust port arranged at a position opposite to the light concentrating mirror in the chamber with reference to a plane passing through the first exhaust port and being perpendicular to an optical axis of the light concentrating mirror; and
a gas exhaust amount adjustment unit configured to adjust a ratio between an exhaust amount of first exhaust gas exhausted from the first exhaust port and an exhaust amount of second exhaust gas exhausted from the second exhaust port.

* * * * *